United States Patent
Petersen et al.

(10) Patent No.: US 10,732,231 B2
(45) Date of Patent: Aug. 4, 2020

(54) SENSOR INTERFACES, SENSOR ARRANGEMENTS, AND OPEN CIRCUIT DETECTION METHODS FOR SENSOR INTERFACES AND ARRANGEMENTS

(71) Applicant: Hamilton Sundstrand Corporation, Charlotte, NC (US)

(72) Inventors: Eric Petersen, Phoenix, AZ (US); Christopher Charles Eberts, Chandler, AZ (US)

(73) Assignee: Hamilton Sundstrand Corporation, Charlotte, NC (US)

(*) Notice: Subject to any disclaimer, the term of this patent is extended or adjusted under 35 U.S.C. 154(b) by 255 days.

(21) Appl. No.: 15/727,356

(22) Filed: Oct. 6, 2017

(65) Prior Publication Data
US 2019/0107571 A1   Apr. 11, 2019

(51) Int. Cl.
| G01R 31/02 | (2006.01) |
|---|---|
| G01R 31/50 | (2020.01) |
| H03K 17/0812 | (2006.01) |
| H03K 17/56 | (2006.01) |
| G05F 1/10 | (2006.01) |
| H03K 17/18 | (2006.01) |
| G01D 3/08 | (2006.01) |
| G01R 31/28 | (2006.01) |

(52) U.S. Cl.
CPC ............ *G01R 31/50* (2020.01); *G01D 3/08* (2013.01); *G01R 31/2829* (2013.01); *G05F 1/10* (2013.01); *H03K 17/0812* (2013.01); *H03K 17/18* (2013.01); *H03K 17/56* (2013.01)

(58) Field of Classification Search
CPC .............. G01R 31/002; G01R 31/2621; G01R 31/2623; G01R 31/2625; G01R 31/2626; G01R 31/2628
See application file for complete search history.

(56) References Cited

U.S. PATENT DOCUMENTS

| 3,944,288 A | 3/1976 | Bertolasi |
| 4,143,926 A | 3/1979 | Miller |
| 4,166,243 A | 8/1979 | West et al. |
| 5,352,938 A | 10/1994 | Wise et al. |
| 8,274,238 B2 * | 9/2012 | Szczeszynski ............ G05F 1/46 315/185 S |

(Continued)

FOREIGN PATENT DOCUMENTS

CN    105686884 A    6/2016

OTHER PUBLICATIONS

Extended European Search Report for European Patent Application No. EP18199088.8, dated Feb. 15, 2019.

*Primary Examiner* — Tung X Nguyen
(74) *Attorney, Agent, or Firm* — Locke Lord LLP; Scott D. Wofsy; Judy R. Naamat

(57) ABSTRACT

A sensor interface includes a sensor circuit, a drive circuit connected to the sensor circuit with active and inactive states, and a back-bias circuit. The back-bias circuit is connected between the drive circuit and the sensor circuit. The back-bias circuit is arranged to allow current to flow from the drive circuit to the sensor circuit when the drive circuit is in the active state. The back-bias circuit is also arranged to limit current flow from the drive circuit to the sensor circuit when the drive circuit is in the inactive state. Sensor arrangements and open circuit detection methods are also described.

19 Claims, 6 Drawing Sheets

(56) References Cited

U.S. PATENT DOCUMENTS

| | | |
|---|---|---|
| 8,917,033 B2 | 12/2014 | Xu et al. |
| 2001/0035723 A1 | 11/2001 | Pelrine et al. |
| 2009/0033236 A1* | 2/2009 | Alexandrov ....... H05B 41/2827 315/224 |
| 2016/0261204 A1 | 9/2016 | Kikuchi et al. |

* cited by examiner

| | BACK-BIAS VOLTAGE (VOLTS) | BACK-BIAS RESISTANCE (OHMS) | DRIVE VOLTAGE (VOLTS) | INACTIVE-STATE RESISTANCE (OHMS) | ANODE VOLTAGE (VOLTS) | LEAKAGE CURRENT (AMPS) |
|---|---|---|---|---|---|---|
| 1 | −15V | ∞ | +5V | 1M | 440mV | 4.5μA |
| 2 | −15V | 1M | +5V | 1M | −5V | −0.2μA |
| 3 | −15V | 1M | +5V | 10M | −13V | −0.2μA |
| 4 | −15V | 1M | +5V | 0.5M | −1.6V | −0.2μA |
| 5 | −15V | 1M | +5V | 0.1M | 0.7V | 27μA |

SENSOR INTERFACES, SENSOR ARRANGEMENTS, AND OPEN CIRCUIT DETECTION METHODS FOR SENSOR INTERFACES AND ARRANGEMENTS

BACKGROUND OF THE INVENTION

1. Field of the Invention

The present disclosure relates to sensor interfaces, and more particularly to open circuit detection in sensor interfaces and sensor arrangements.

2. Description of Related Art

Sensing circuits are commonly used to monitor parameters in equipment or processes at remote locations. Examples of systems employing sensors are gas turbine engines and braking systems, which can employ sensors for monitoring parameters like temperature during operation. In some applications it can be necessary to monitor the sensor and associated interface during operation for open circuit conditions, which if undetected could otherwise cause the sensing circuit to provide an unreliable indication of a monitored parameter.

One approach to open circuit monitoring is to apply a voltage potential across the sensing circuit and measure current flow through the sensing circuit. When the sensing circuit is closed the resistance of the sensing circuit is relatively low, and the associated high current flow indicates that the circuit is closed. When the sensing circuit develops an open condition resistance increases, the associated low current flow providing indication of the open condition. The open monitoring is typically done such that the monitoring activity has limited impact on the accuracy of the parameter being measured by the sensing circuit during open monitoring.

Such conventional methods and systems have generally been considered satisfactory for their intended purpose. However, there is still a need in the art for improved sensor interfaces, sensor arrangements, and open detection methods for sensor interfaces and sensor arrangements. The present disclosure provides a solution for this need.

SUMMARY OF THE INVENTION

A sensor interface includes a sensor circuit, a drive circuit connected to the sensor circuit with active and inactive states, and a back-bias circuit. The back-bias circuit is connected between the drive circuit and the sensor circuit. The back-bias circuit is arranged to allow current to flow from the drive circuit to the sensor circuit when the drive circuit is in the active state. The back-bias circuit is also arranged to limit current flow from the drive circuit to the sensor circuit when the drive circuit is in inactive state.

In certain embodiments, the sensor interface can include a diode. The diode can connect the drive circuit to the sensor circuit. The diode can be arranged to oppose current flow from the sensor circuit to the drive circuit. The back-bias circuit can include a back-bias resistor. The back-bias resistor can be connected to the diode. The back-bias resistor can have electrical resistance that is less than or equal to resistance of the drive circuit when in the inactive state. The back-bias circuit can include a back-bias voltage source. The back-bias resistor can connect the back-bias voltage source to the diode.

In accordance with certain embodiments, the drive circuit can include a drive voltage source. The drive circuit can connect the drive voltage source to the diode. Voltage of the back-bias voltage source can be less than voltage of the drive voltage source to back-bias the diode. The drive circuit can include a switch. The switch can connect the drive circuit to the sensor circuit. The switch can have off-state resistance that is greater than or equal to resistance of the back-bias circuit. It is contemplated that the switch can include a solid-state switch device with a gate. A controller can be operatively connected to the gate of the solid-state switch device.

It is also contemplated that, in accordance with certain embodiments, the switch can connect the drive voltage source of the drive circuit to the sensor circuit. The sensor circuit can include a high-side lead and a low-side lead. The back-bias circuit can be connected to the high-side lead. The drive circuit can be connected to the high-side lead. A differential voltage source can be connected in series between the high-side lead and the low-side lead. A thermocouple connected in series between the high-side lead and the low-side lead.

A sensor arrangement includes a sensor interface as described above. The sensor circuit includes a high-side lead and a low-side lead. A differential voltage source is connected in series between the high-side lead and the low-side lead of the sensor circuit. A diode is connected to the sensor circuit and is arranged oppose current flow from the sensor circuit to the drive circuit. The drive circuit includes a switch, the switch connecting the drive circuit to the diode. The back-bias circuit is connected to the high-side lead through the diode, the back-bias circuit having resistance that is less than or equal to resistance of the drive circuit in the inactive state.

In certain embodiments, the back-bias circuit can include a back-bias voltage source. The back-bias voltage source can be connected to the diode. The drive circuit can include a drive voltage source. The drive voltage source can be connected to the diode. Voltage of the back-bias voltage source can be less than voltage of the drive voltage source. The back-bias circuit can include a back-bias resistor. The back-bias resistor can be connected to the diode. The back-bias resistor can have resistance that less than or equal to resistance of the drive circuit in the inactive state. The differential voltage source can include a thermocouple. A brake friction pad can be in thermal communication with the differential voltage source or the thermocouple.

An open circuit detection method for a sensor interface as described above includes applying voltage to the sensor circuit when the drive circuit is in the active state and determining whether the sensor circuit is open based on current flow from the drive circuit to the sensor circuit when the drive circuit is in the active state. When the drive circuit is in the inactive state a diode connecting the drive circuit to the sensor interface is back-biased to limit current flow from the drive circuit to the sensor interface when the drive circuit is in the inactive state These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 5 is a table of leakage current between the sensor circuit and drive circuit according to different implementations of the sensor interface of FIG. 1, showing implementations with little or no leakage current flow from the drive circuit to the sensor circuit.

DETAILED DESCRIPTION OF THE PREFERRED EMBODIMENTS

Figure 1:
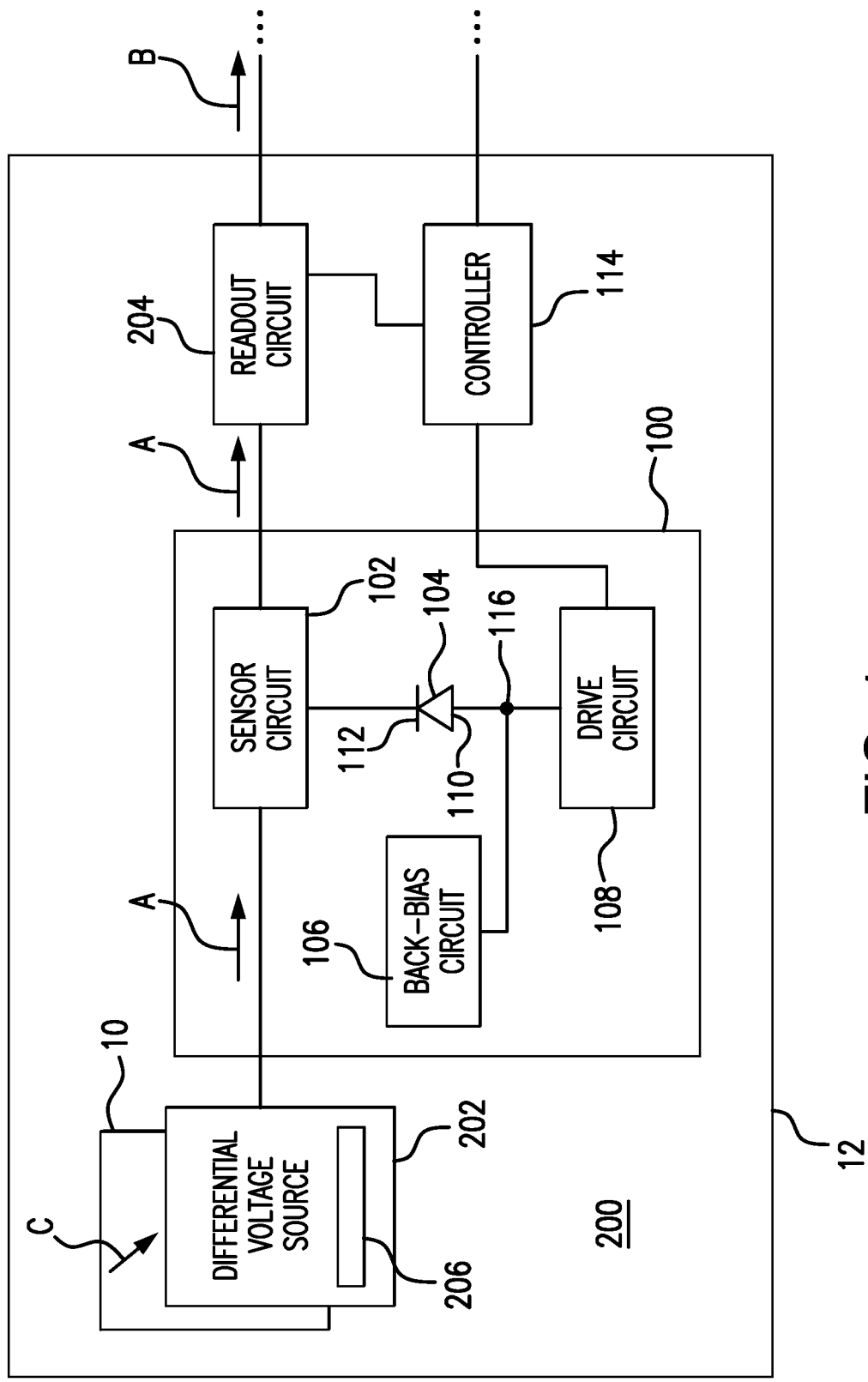
FIG. 1 is a block diagram of an exemplary embodiment of a sensor arrangement constructed in accordance with the present disclosure, schematically showing a sensor interface with a drive circuit and a back-bias circuit.

Reference will now be made to the drawings wherein like reference numerals identify similar structural features or aspects of the subject disclosure. For purposes of explanation and illustration, and not limitation, a partial view of an exemplary embodiment of a sensor interface in accordance with the disclosure is shown in FIG. 1 and is designated generally by reference character 100. Other embodiments of sensor interfaces, sensor arrangements, and open circuit detection methods in accordance with the disclosure, or aspects thereof, are provided in FIGS. 2-6, as will be described. The systems and methods described herein can be used for open circuit detection in sensor circuits and sensor circuit arrangements for differential voltage sources, such as thermocouples employed for monitoring friction pad temperature in aircraft braking systems, though the present disclosure is not limited to braking systems or to thermocouple differential voltage sources in general.

Referring to FIG. 1, a sensor arrangement 200 is shown. Sensor arrangement 200 includes sensor interface 100 with a sensor circuit 102, a differential voltage source 202, and a readout circuit 204. Readout circuit 204 is connected to sensor circuit 102 and therethrough to differential voltage source 202. Connection through sensor circuit 102 places readout circuit 204 in electrical communication with differential voltage source 202, sensor circuit 102 thereby communicating a differential voltage signal A from differential voltage source 202 to readout circuit 204.

Readout circuit 204 is arranged to receive a voltage signal A from sensor circuit 102. Based on voltage signal A, readout circuit 204 provides an output B to an output lead associated with the magnitude of voltage signal A. Generating output B can include, by way of non-limiting example, amplification via an amplifier (not shown for reasons of clarity). Examples of suitable readout circuits include that described in U.S. Pat. No. 4,166,243 to West et al., issued on Aug. 28, 1979, the contents of which are incorporated herein by reference in its entirety.

Differential voltage source 202 is arranged to generate voltage signal A. Voltage signal A can arise, for example, according to change in a device operatively connected to differential voltage source 202. In certain embodiments differential voltage source 202 can include a thermocouple 206. Thermocouple 206 is disposed in thermal communication C with a device of interest 10, voltage signal A varying according to change in temperature of device of interest 10. Device of interest 10 can be a friction pad of landing gear system for an aircraft 12.

Sensor interface 100 includes sensor circuit 102, a diode 104, a back-bias circuit 106 and a drive circuit 108. Diode 104 is arranged to oppose current flow from sensor circuit 102 to drive circuit 108, and has an anode 110 and a cathode 112. Cathode 112 is connected to sensor circuit 102. Anode 110 is connected to both back-bias circuit 106 and drive circuit 108 through an intermediate node 116.

A controller 114 is operably connected to drive circuit 108. Controller 114 and is arranged to cause drive circuit to apply a test voltage to sensor circuit 102 for open detection. Controller 114 is also disposed in communication with readout circuit 204 to monitor the affect the test voltage on readout circuit output B, controller 114 thereby determining whether sensor circuit 102 is open. In this respect controller 114 is arranged to toggle drive circuit between an active state (shown in FIG. 3), wherein drive circuit applies a drive voltage 138 to diode 104 sufficient to forward bias diode 104 and test sensor circuit 102 for an open circuit condition, and an inactive state (shown in FIG. 4), wherein an intervening switch 124 (shown in FIG. 2) is toggled to an off-state to remove the drive voltage 138 from diode 104. Examples of suitable open detection controllers include those described in U.S. Pat. No. 8,274,238 to Szczeszynski et al., issued on Sep. 25, 2012, the contents of which is incorporated herein by reference in its entirety.

As will be appreciated by those of skill in art, open detection functionality can provide indication of whether voltage signal A is reliably indicative of the condition of device of interest 10. This can be important is certain types of differential voltage sources, such as thermocouples, where voltage output by a differential voltage source when open can be within the expected range of output voltages of the differential voltage source.

As will also be appreciated by those of skill in the art in view of the present disclosure, some open detection circuits can leak current into the monitored sensor circuit. Such leakage currents can alter the magnitude of voltage signal generated by the differential voltage source connected to the sensor circuit. Although such leakage currents generally do not alter the differential voltage source output voltage signal significantly, the leakage current can consume a relatively large portion of the error budge in certain sensor arrangements, rendering incorporation of open circuit detection impossible for certain types of sensor arrangements. As a countermeasure to excessive inactive state current leakage flow, e.g., leakage current flow i (shown in FIG. 4), sensor interface 100 includes back-bias circuit 106.

Back-bias circuit 106 is connected between drive circuit 108 and sensor circuit 102. More particularly, back-bias circuit 106 is connected to anode 110 at 110 through an intermediate node 116 and is arranged to accept leakage current from drive circuit 108 through intermediate node 116 when drive circuit 108 is in the inactive state (shown in FIG. 4). Back-bias circuiting current flow from drive circuit 108 into back-bias circuit 106 when drive circuit 108 is in the inactive state prevents substantially all leakage current from drive circuit 108 from reaching sensor circuit 102, improving accuracy of sensor circuit 102 when drive circuit 108 is inactive.

Figure 2:
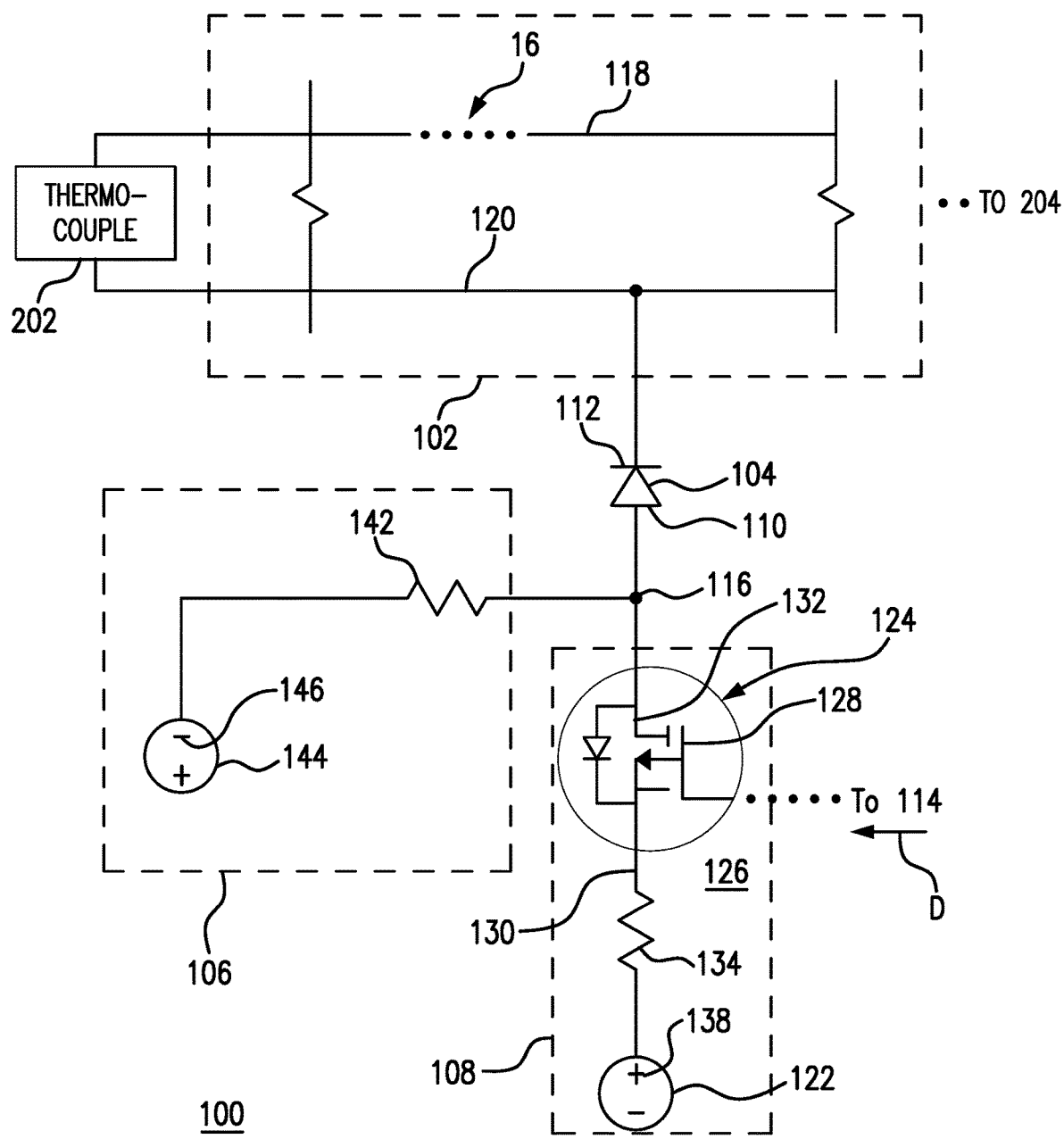
FIG. 2 is a circuit diagram of the sensor interface of FIG. 1, schematically showing circuit elements of the sensor circuit, the drive circuit, and the back-bias circuit.

With reference to FIG. 2, sensor interface 100 is shown. Sensor circuit 102 includes a low-side lead 118 and a high-side lead 120. Differential voltage source 202 is connected in series between low-side lead 118 and high-side lead 120. In the illustrated exemplary embodiments differential voltage source 202 is indicated as a thermocouple. This is for illustration purposes only and is non-limiting. Diode 104 is connected to high-side lead 120. More particularly cathode 112 of diode 104 is connected to high-side lead for detection an open circuit, e.g., open circuit 16, in sensor circuit 102.

Drive circuit 108 includes a drive voltage source 122 and a switch 124. Drive voltage source 122 is arranged to apply a drive voltage 138 to intermediate node 116 when connected thereto by switch 124 for applying voltage from drive circuit 108 to sensor circuit 102 when drive circuit 108 is in the active state (shown in FIG. 3).

Switch 124 can include one or more solid-state switch device 126. Solid-state switch device 126 can be an NMOS-type or a PMOS type solid-state switch device and has a gate 128, a source 130, and a drain 132. Drain 132 is connected to intermediate node 116, and therethrough to anode 110 of diode 104 and to back-bias circuit 106. Source 130 is connected to drive voltage source 122. Gate 128 is connected to controller 114 (shown in FIG. 1) and receives therethrough command signals D.

Solid-state switch device 126 is arranged such that command signals D toggles solid-state switch device 126 between an on-state and an off-state. In the on-state, solid-state switch device 126 connects drive voltage source 122 to high-side lead 120. This places placing drive circuit 108 in the active state (shown in FIG. 3). In the off-state, solid-state switch device 126 applies an off-state resistance 134 to drive circuit 108. Application of off-state resistance 134 to drive circuit 108 places drive circuit in the inactive state (shown in FIG. 4).

Figure 4:
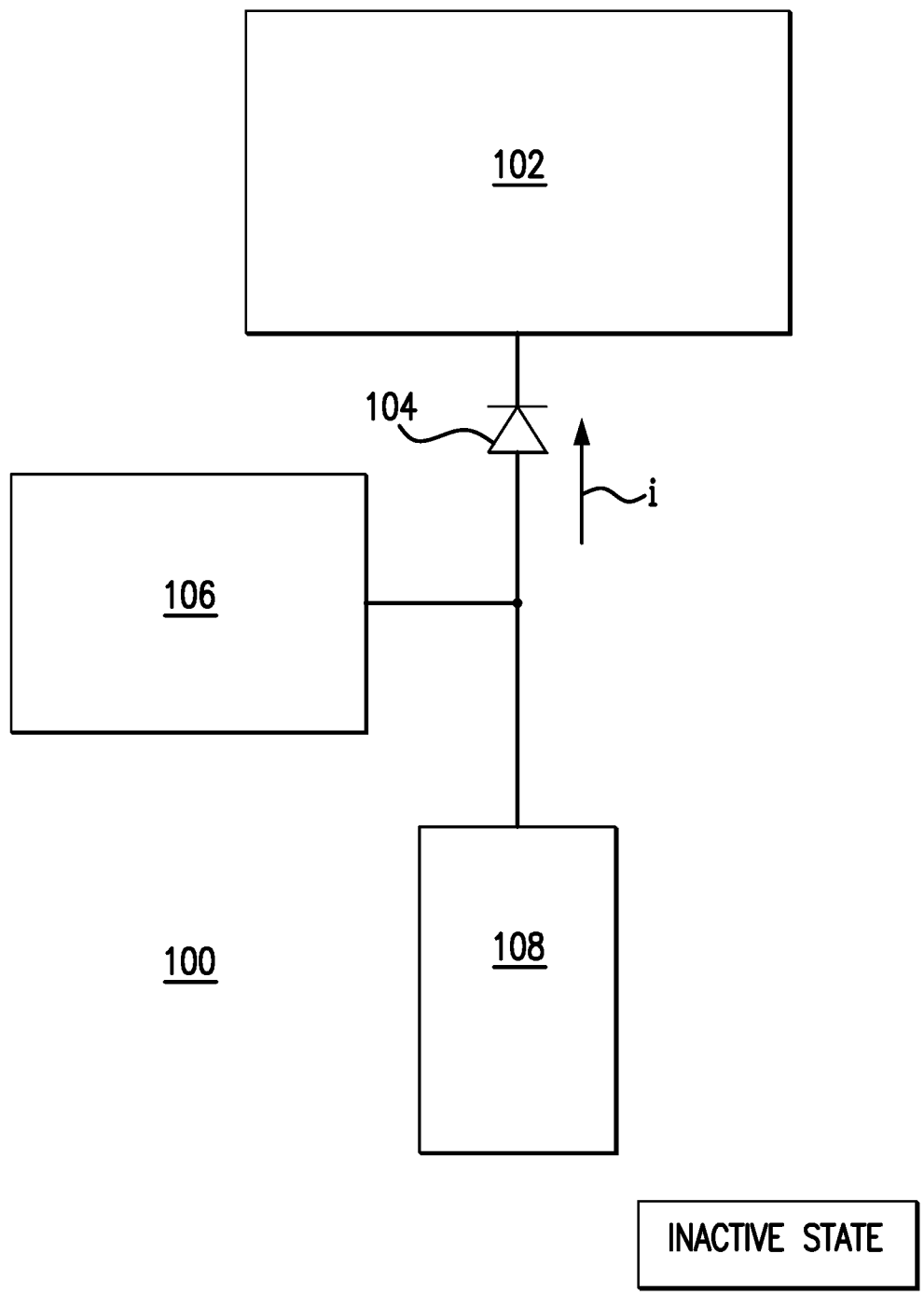

Back-bias circuit 106 includes a back-bias circuit 140 arranged to back-bias circuit current flow from drive circuit 108 into back-bias circuit 106 when drive circuit 108 is in the inactive state (shown in FIG. 4). In this respect back-bias circuit 106 includes a back-bias resistor 142 and a back-bias voltage source 144. Back-bias resistor 142 is connected to diode 104. More particularly, back-bias resistor 142 is connected in intermediate node 116, and therethrough to both the anode 110 of diode 104 and the drain 132 of solid-state switch device 126. It is contemplated that back-bias resistor 142 have an electrical resistance that is less than or equal to the electrical resistance of drive circuit 108 when in the inactive state (shown in FIG. 4). In certain embodiments, the electrical resistance of back-bias resistor 142 is less than or equal to the electrical resistance of solid-state switch device 126 in the off-state, i.e., is less than or equal to off-state resistance 134.

Back-bias voltage source 144 is connected to back-bias resistor 142. More particularly, back-bias voltage source 144 is connected to back-bias resistor 142, and therethrough to intermediate node 116, and thereby to both anode 110 of diode 104 and drain 132 of solid-state switch device 126. It is contemplated that back-bias voltage source 144 have a negative back-bias voltage 146. Back-bias voltage 146 is less than drive voltage 138, less meaning that the magnitude (i.e. absolute value) of back-bias voltage 146 is larger than the magnitude of drive voltage 138. In cooperation with the relative resistances of back-bias resistor 142 and off-state resistance 134 of solid-state switch device 126, negative voltage causes leakage current flowing through the body diode of solid-state switch device 126 to flow to back-bias voltage source 144, back-biasing diode 104, and preventing voltage associated with the leakage from forward biasing diode 104—isolating the leakage current from sensor circuit 102.

Figure 3:
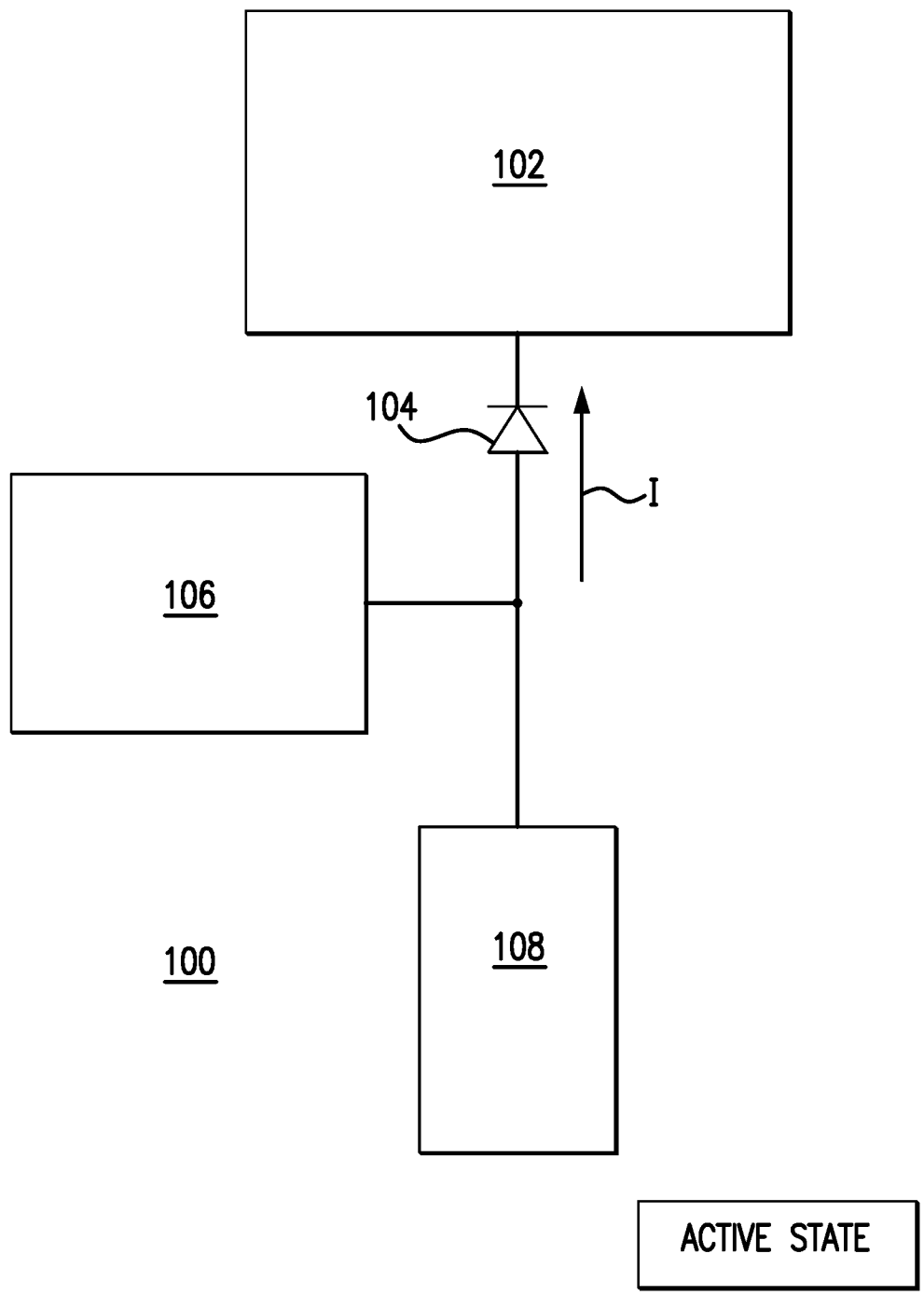
FIGS. 3 and 4 are block diagrams of the sensor interface of FIG. 1, showing the drive circuit in an active state and in an inactive state.

With reference to FIGS. 3 and 4, sensor interface 100 is shown in an active state, shown in FIG. 3, and in an inactive state (shown in FIG. 4). In the active state drive circuit 108 applies voltage sufficient to forward bias diode 104, allowing a current flow I to traverse diode 104. It is contemplated that current flow I be off-scale, meaning the resultant differential voltage signal A (shown in FIG. 1) is outside the range of differential output voltages from differential voltage source 202 (shown in FIG. 1).

In the inactive state (shown in FIG. 4) back-bias circuit 106 attenuates leakage current i flowing through diode 104. It is contemplated that back-bias circuit 106 limit leakage current flow i such that the associated voltage is insufficient to forward bias diode 104, current flowing diode 104 having very little (if any) impact on the accuracy of differential voltage signal A (shown in FIG. 1).

Referring now to FIG. 5, a table 300 of exemplary leakage current flows is shown for conditions 1-5 of sensor interface 100. Table 300 shows leakage current flow i through diode 104 as a function of back-bias voltage 146 of back-bias voltage source 144, resistance of back-bias resistor 142, off-state state resistance 134 of drive circuit 108, and drive voltage 138. Notably, in conditions 2-4 voltage applied to anode 110 of diode 104 was found to be insufficient to forward bias diode 104, resulting in leakage current flow i of magnitude insufficient to degrade differential voltage signal A (shown in FIG. 1).

As shown in the first row of table 300, when back-bias resistor 142 has infinite resistance leakage current i through diode 104 am about 4.5 micro-amps, which can consume an unacceptable portion of the error budget in some sensor arrangement.

The second row of table 300 shows a first exemplary implementation of sensor interface 100 (shown in FIG. 1). Notably, when a back bias circuit is connected to anode 110 of diode 104 with a back-bias resistance of 1 mega-ohm and a back-bias voltage of −5 volts, and an open-detect voltage of +5 volts applied through a switch with an off-state resistance of 1 mega-ohm, the resulting voltage at anode 110 drops from the 440 millivolts exhibited in condition 1 to −5 volts. Since −5 volts is insufficient to forward bias diode 104, leakage current in condition 2 drops to about −0.2 micro-amps. Leakage currents in this range are acceptable insofar as the accuracy impact to sensor arrangement 200 (shown in FIG. 1) is more than offset by the advantages of the added open circuit detection capability provided by drive circuit 108.

The third row of table 300 shows an implementation of sensor interface 100 where in the inactive-state resistance of drive circuit 108 is increased to 10 mega-ohms in comparison to condition 2. This causes the voltage applied to anode 110 of diode 104 to further drop. Notably, leakage current i remain substantially equivalent to that of condition 2, indicating the added expense of selecting a solid-state switch device with increased off-state resistance brings little additional benefit for the added expense.

The fourth row of table 300 shows an implementation of sensor interface 100 where in the inactive-state resistance of drive circuit 108 is decreased to 0.5 mega-ohms in comparison to condition 2. This causes the voltage applied to anode 110 of diode 104 to increase to about −1.6 volts. Notably, leakage current i remain substantially equivalent to that of conditions 2 and 3 as this voltage too is insufficient to forward bias diode 104. This suggests that it may be possible to select a switch 124 with lower off-state resistance, which can potentially reduce the cost of drive circuit 108.

The fifth row of table 300 indicates that there is a point where further reduction in the off-state resistance of switch 124 begins to drive leakage current i to unacceptable levels notwithstanding the advantageous effect of back-biasing diode 104. Notably, when the off-state resistance of switch 124 drops to 0.1 mega-ohms voltage applied to anode 110 of diode 104 rises to 0.7 volts—which is sufficient to forward bias diode 104—and results in a leakage current of 27 micro-amps, which can consume an unacceptable portion of the error budget of sensor arrangement 200.

Figure 6:
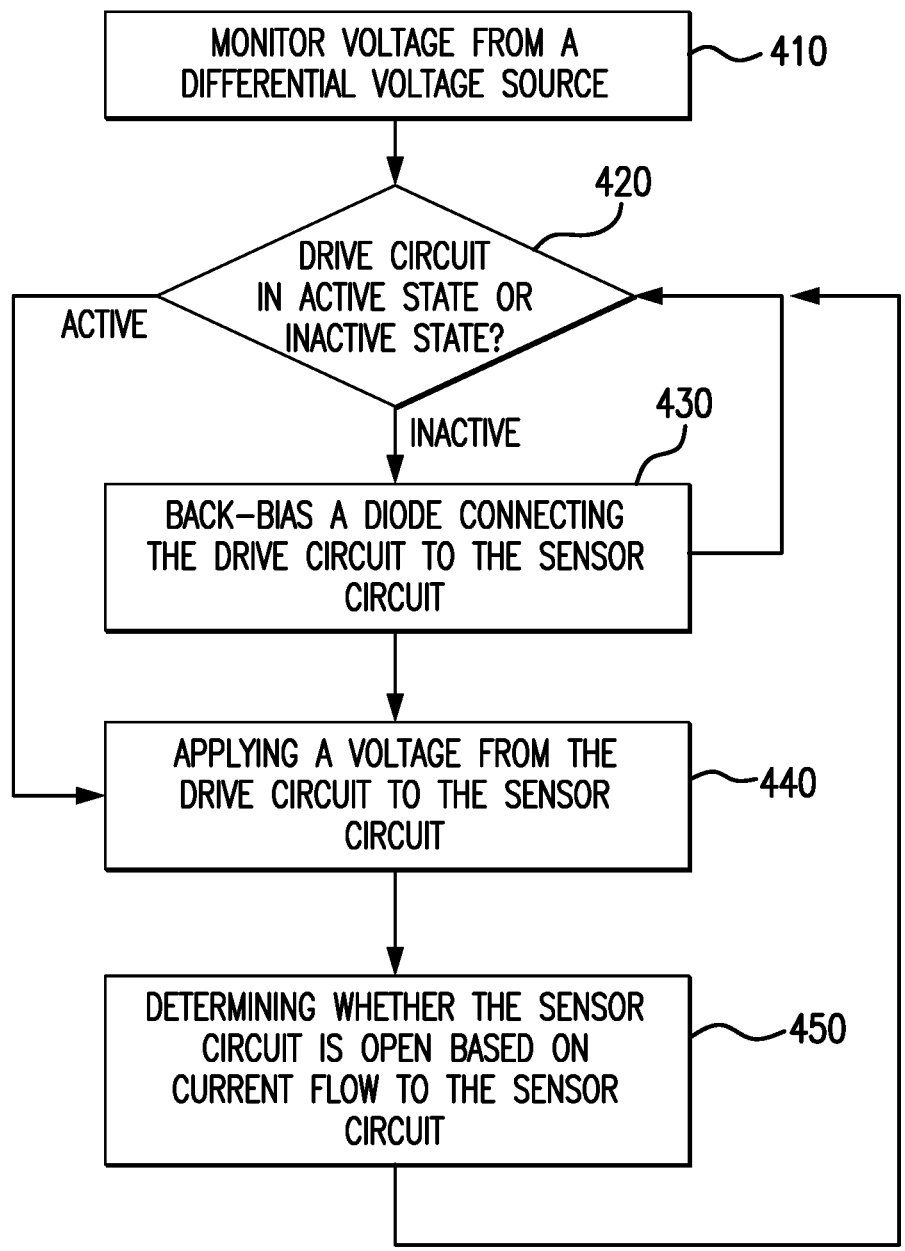
FIG. 6 is a block diagram of an open circuit detection method for the sensor interface and sensor arrangement of FIG. 1, showing steps of the method.

With reference to FIG. 6, an open circuit detection method 400 for a sensor interface, e.g., sensor interface 100 (shown in FIG. 1), is shown. Method 400 includes monitoring voltage from a differential voltage source, e.g., differential voltage source 202 (shown in FIG. 1), as shown with box 410. During monitoring the drive circuit is determined to either be in an active state (shown in FIG. 3) or an inactive state (shown in FIG. 4), as shown with box 420. When the circuit is in the inactive state a diode, e.g., diode 104 (shown in FIG. 1), is back-biased, as show with box 430. When the circuit is in the active state a voltage from a drive circuit, e.g., drive circuit 108, is applied to the sensor circuit, as shown with box 440. Based on resultant current flow in the sensor circuit a determination is made as to whether the sensor circuit is open or closed, as shown with box 450.

Direct current (DC) off-scale drive circuitry can be used to detect open conditions in sensing circuits, e.g., sensor circuit 102 (shown in FIG. 1). In some sensor circuits, such as in high accuracy low level applications, DC off-scale drive circuitry can consume relatively large portions of the required accuracy band of the sensor communicative with the sensing circuit. In certain applications the impact of open circuit monitoring using DC off-scale drive circuitry can increase the sensor error by 1.65% or more, which can exceed the error budget in some application.

One approach to the problem open monitoring inducing error in sensor circuit output is the use of a switched open monitoring circuit. Switched open circuit monitoring circuits employ a switched DC off-scale driver circuits, e.g., drive circuit 108 (shown in FIG. 1). Such switched DC off-scale driver circuits can generally reduce the accuracy penalty associated with open condition monitoring to increases in sensor error on the order of about 0.8%. While generally satisfactory for its intended purpose, errors of this side can still be prohibitive in some applications, thermocouples used for temperature sensing in aircraft brake systems, where errors of 0.8% can drive temperature accuracy errors of 3 degrees Celsius or more, potentially making open circuit monitoring prohibitive in such applications.

In embodiments described herein DC off-scale drive circuitry for open condition monitoring is supplemented a back-biased diode, e.g., diode 104 (shown in FIG. 1). The back-biased diode is connected to a drive voltage source, e.g., drive voltage source 122 (shown in FIG. 2), for checking for open condition of the sensor circuit by applying a positive voltage to the anode. In certain embodiments, back-biasing of the diode by a back-bias circuit, e.g., back-bias circuit 106, allows only a very small amount of leakage current to reach the sensing circuit by limiting the forward bias voltage applied to the diode. This prevents the open circuit monitoring circuitry from reducing the accuracy of the measurement information conveyed by the differential voltage signal carried by the sensing circuit. Applicant's demonstration experimentation with the circuit arrangement has shown that the error associated with open condition monitoring can be restricted by 0.01% or less with the use of a back-bias circuit, e.g., back-biased circuit 106 (shown in FIG. 1), incorporating the back-biased diode.

The methods and systems of the present disclosure, as described above and shown in the drawings, provide for open detectors and methods of detecting open circuits with superior properties including reduced current leakage from the detection circuit to the monitored circuit through the use of a back-biased diode. In certain embodiments a resistor with resistance that is slightly less than the on-resistance of the switch connecting the diode to the voltage source is also employed to further reduce leakage from the detection circuit to the monitored circuit. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A sensor interface, comprising:
 a sensor circuit;
 a drive circuit connected to the sensor circuit with active and inactive states;
 a back-bias circuit connected between the drive circuit and the sensor circuit; and
 a diode connecting the drive circuit to the sensor circuit, the diode arranged to oppose current flow from the sensor circuit to the drive circuit,
 wherein the back-bias circuit is arranged to allow current to flow from the drive circuit to the sensor circuit when the drive circuit is in the active state, and
 wherein the back-bias circuit is arranged to limit current flow from the drive circuit to the sensor circuit when the drive circuit is in the inactive state.

2. The sensor interface as recited in claim 1, wherein back-bias circuit includes a back-bias resistor, the back-bias resistor connected to the diode.

3. The sensor interface as recited in claim 2, wherein the back-bias resistor has electrical resistance that is less than or equal to resistance of the drive circuit when in the inactive state.

4. The sensor interface as recited in claim 1, wherein the back-bias circuit includes a back-bias voltage source, a back-bias resistor of the back-bias circuit connecting the back-bias voltage source to the diode.

5. The sensor interface as recited in claim 4, wherein the drive circuit includes a drive voltage source, the drive circuit connecting the drive voltage source to the diode, wherein the back-bias voltage source is less than the drive voltage source.

6. The sensor interface as recited in claim 1, wherein the drive circuit includes a switch, the switch connecting the drive circuit to the sensor circuit.

7. A sensor interface, comprising:
 a sensor circuit;
 a drive circuit connected to the sensor circuit with active and inactive states; and
 a back-bias circuit connected between the drive circuit and the sensor circuit,
 wherein the back-bias circuit is arranged to allow current to flow from the drive circuit to the sensor circuit when the drive circuit is in the active state,
 wherein the back-bias circuit is arranged to limit current flow from the drive circuit to the sensor circuit when the drive circuit is in the inactive state, wherein the drive circuit includes a switch, the switch connecting the drive circuit to the sensor circuit, and wherein the drive circuit includes a drive voltage source, the switch connecting the drive voltage source to the sensor circuit.

8. The sensor interface as recited in claim 7, wherein the switch has off-state resistance greater than or equal to resistance of the back-bias circuit.

9. The sensor interface as recited in claim 7, wherein the switch includes a solid-state switch device with a gate, and further comprising a controller operatively connected to the gate of the solid-state switch device.

10. A sensor interface comprising:
a sensor circuit;
a drive circuit connected to the sensor circuit with active and inactive states; and
a back-bias circuit connected between the drive circuit and the sensor circuit,
wherein the back-bias circuit is arranged to allow current to flow from the drive circuit to the sensor circuit when the drive circuit is in the active state,
wherein the back-bias circuit is arranged to limit current flow from the drive circuit to the sensor circuit when the drive circuit is in the inactive state, and
wherein the sensor circuit includes a high-side lead and a low-side lead, the back-bias circuit and the drive circuit both connected to the high-side lead.

11. The sensor interface as recited in claim 10, further comprising a differential voltage source connected in series between the high-side lead and the low-side lead.

12. The sensor interface as recited in claim 10, further comprising a thermocouple connected in series between the high-side lead and the low-side lead.

13. A sensor arrangement, comprising:
a sensor interface as recited in claim 1, wherein the sensor circuit includes a high-side lead and a low-side lead, the back-bias circuit connected to the high-side lead;
a differential voltage source connected in series between the high-side lead and the low-side lead of the sensor circuit;
a diode connected to the sensor circuit and arranged oppose current flow from the sensor circuit to the drive circuit, wherein the drive circuit includes a switch, the switch connecting the drive circuit to the diode, and wherein the back-bias circuit is connected to the diode and has resistance that is less than or equal to resistance of the drive circuit in the inactive state.

14. The sensor arrangement as recited in claim 13, wherein the back-bias circuit includes a back-bias voltage source, the back-bias voltage source connected to the diode, wherein the drive circuit includes a drive voltage source, the drive voltage source connected to the diode, wherein voltage of the back-bias voltage source is lower than voltage of the drive voltage source.

15. The sensor arrangement as recited in claim 13, wherein magnitude of the back-bias voltage source is greater than magnitude of the drive voltage source.

16. The sensor arrangement as recited in claim 13, wherein the back-bias circuit includes a back-bias resistor, the back-bias resistor connected to the diode, wherein the back-bias resistor has resistance that is less than or equal to resistance of the drive circuit in the inactive state.

17. The sensor arrangement as recited in claim 13, wherein the differential voltage source includes a thermocouple.

18. The sensor arrangement as recited in claim 13, further comprising a brake friction pad in thermal communication with the differential voltage source.

19. An open circuit detection method, comprising:
at a sensor interface having a sensor circuit, a drive circuit connected to the sensor circuit with active and inactive states, and a back-bias circuit connected between the drive circuit and the sensor circuit,
applying voltage from the drive circuit to the sensor circuit when the drive circuit is in the active state; and
determining whether the sensor circuit is open based on current flow from the drive circuit to the sensor circuit when the drive circuit is in the active state; and
back-biasing a diode connecting the drive circuit to the sensor interface when the drive circuit is in the inactive state to limit current flow to the sensor interface when the drive circuit is in the inactive state.

* * * * *